United States Patent [19]

Kawakami

[11] Patent Number: 5,099,790
[45] Date of Patent: Mar. 31, 1992

[54] MICROWAVE PLASMA CHEMICAL VAPOR DEPOSITION APPARATUS

[75] Inventor: Soichiro Kawakami, Nagahama, Japan

[73] Assignee: Canon Kabushiki Kaisha, Tokyo, Japan

[21] Appl. No.: 754,378

[22] Filed: Aug. 30, 1991

Related U.S. Application Data

[63] Continuation of Ser. No. 373,033, Jun. 29, 1989, abandoned.

[30] Foreign Application Priority Data

Jul. 1, 1988 [JP] Japan .................................. 63-164205

[51] Int. Cl.$^5$ .............................................. C23C 16/50
[52] U.S. Cl. ...................................... 118/723; 427/39; 427/45.1; 427/47
[58] Field of Search ................... 118/723; 204/298.16, 204/298.17, 298.18, 298.2, 298.22, 298.37; 427/39, 45.1, 47; 156/345, 643

[56] References Cited

U.S. PATENT DOCUMENTS

| | | | |
|---|---|---|---|
| 4,559,100 | 12/1985 | Ninomiya et al. | 156/345 |
| 4,631,106 | 12/1986 | Nakazato et al. | 156/345 |
| 4,740,268 | 4/1988 | Bukhman | 156/643 |
| 4,761,219 | 8/1988 | Sasaki et al. | 204/298.37 |
| 4,842,707 | 6/1989 | Kinoshita | 204/298 |

FOREIGN PATENT DOCUMENTS

| | | | |
|---|---|---|---|
| 58-177135 | 10/1983 | Japan | 427/39 |
| 59-205470 | 11/1984 | Japan | 118/723 |
| 60-45024 | 3/1985 | Japan | 204/298.37 |
| 61-87868 | 5/1986 | Japan | 427/39 |
| 61-213377 | 9/1986 | Japan | 118/723 |
| 61-224324 | 10/1986 | Japan | 118/723 |
| 61-243168 | 10/1986 | Japan | 204/298.16 |
| 61-284579 | 12/1986 | Japan | 118/723 |
| 63-7364 | 1/1988 | Japan | 204/298.16 |

*Primary Examiner*—Shrive Beck
*Assistant Examiner*—Terry J. Owens
*Attorney, Agent, or Firm*—Fitzpatrick, Cella, Harper & Scinto

[57] ABSTRACT

In a microwave plasma CVD apparatus in which material gas is formed into plasmas by electric discharge of microwaves in a plasma generating chamber provided with a first magnetic field generating device introduced into a deposition chamber and reacted with starting material gas introduced in the deposition chamber, to form a deposited film on a substrate, a second magnetic field generation device is situated at the rear side of a substrate table disposed in the deposition chamber with one of the magnetic poles thereof being faced to the magnetic pole, at the opposite polarity, of the first magnetic field generating device situated on the side of the deposition chamber, so that the time-averaged magnetic flux density is made uniform on the surface of the specimen substrate, thereby making the plasma density more uniform on the substrate and making the distribution of the deposited film thickness more uniform.

8 Claims, 10 Drawing Sheets

FIG. 3(I)-A
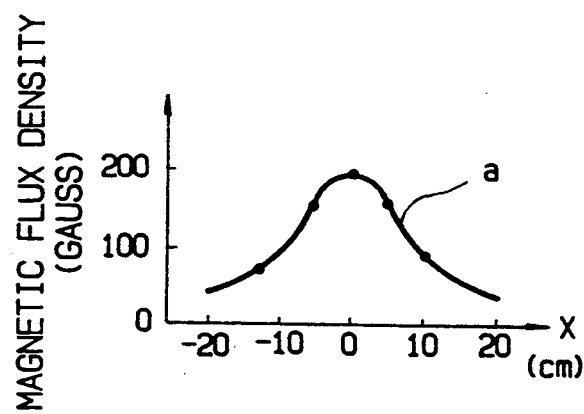
FIG. 3(I)-B
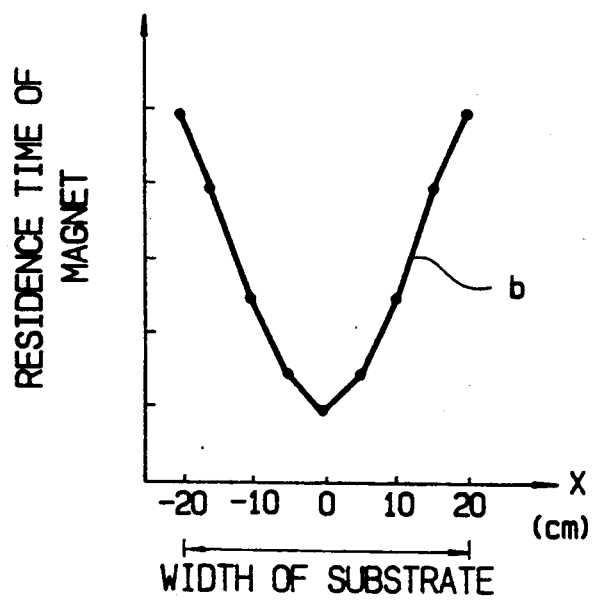

WIDTH OF SUBSTRATE

WIDTH OF SUBSTRATE

EXHAUST

MICROWAVE PLASMA CHEMICAL VAPOR DEPOSITION APPARATUS

This application is a continuation of application Ser. No. 07/373,033 filed June 29, 1989, now abandoned.

FIELD OF THE INVENTION

The present invention relates to an improved apparatus suitable for forming various functional deposited films usable in various electronic devices. More particularly, the present invention relates to an improved apparatus suitable for forming various functional deposited semiconductor thin films by means of a plasma chemical vapor deposition process (hereinafter referred to as "plasma CVD process") utilizing plasmas formed by microwave discharge in raw material gas (this process hereinafter being referred to as "microwave plasma CVD process").

BACKGROUND OF THE INVENTION

Since the plasma CVD process has various advantages, for example, (i) deposited films can be formed at a low temperature from 200° to 400° C., (ii) heat resistance is not required for the substrate, etc., it has been applied so far for the preparation of silicon dioxide or silicon nitride as insulative films in semiconductor production processes, amorphous silicon (a-Si) films used for solar cells, as well as contact type image sensors or photosensitive drums, and diamond thin films.

Most of the conventional plasma CVD apparatus for conducting the plasma CVD process have been so adapted that radio frequency waves (RF) are charged between two opposing flat-parallel plate electrodes to generate plasmas. Since the RF plasma CVD apparatus is simple in structure, it has a merit that the size can be readily increased.

By the way, the conventional RF plasma CVD processes have the following drawbacks (1), (2) and (3): (1) Ionic sheaths are formed to each of the electrodes, a negative self-bias appears on the side of the cathode and ion species in plasmas are attracted to the cathode to moderate the incident impact of the ionic species to the anode to which the substrate is arranged. However, ionic species incident to the surface of the substrate are still present, and they are intaken into deposited films to increase the internal stress or density of defects, failing to obtain satisfactory deposited films,: (2) since the density of electrons is as low as from $10^{-8}$ to $10^{10}$, decomposing efficiency for starting material gases is not so great and the deposition rate is low,: and (3) since the electron temperature is as low as below 40 eV, it is difficult to decompose those starting material gases having high bonding energy such as halogenated silicon compounds.

In order to overcome the foregoing drawbacks (1), (2) and (3) in the plasma CVD process utilizing RF discharge, there have been developed plasma CVD apparatus using a microwave discharge system of applying electronic cyclotron resonance as disclosed in Japanese Patent Laid-Open Nos. Sho 56-155535 and Sho 59-3018. FIG. 8 illustrates one example of a schematic constitutional view for an ECR plasma CVD apparatus.

In FIG. 8, there are shown a plasma generating chamber 801 (having a cavity resonator structure), a magnetic field generating device 802, a microwave guide 803, a microwave introducing window 804, microwaves 805, plasma flow and diverging magnetic field 806, a deposition chamber 807, a specimen table 808 with heaters, a specimen substrate 809, a first gas introduction port 810, a second gas introduction port 811 and an exhaust system 813. In the ECR plasma CVD process, since electrons absorb energy of electromagnetic waves upon resonance under ECR conditions (requiring magnetic flux density of 875 gauss for microwave of 2.45 GHz), the electron temperature is high as up to 7 eV and electron density is also as high as $10^{11}$. Accordingly, a deposition rate of from 100 to 1000 Å/min can be obtained. Further, the incident ion energy is as small as upto 20 eV when compared with the parallel flat plate type plasma CVD process.

FIG. 9 shows the distribution of magnetic flux density within the plane of the substrate apart by 290 mm from the point when the magnetic flux density is 875 gauss under ECR conditions in a case where the diameter of the plasma generating chamber 801 is 170 mm in the ECR plasma CVD apparatus shown in FIG. 8. It can be seen that the range in which the magnetic flux density is uniform is a small region of about 80 mm.

In the ECR plasma CVD process, since the distribution of the magnetic flux density on the specimen substrate has an effect on the distribution of the thickness of the deposited film, it is necessary to make the magnetic flux film over a large area, that is, it requires solenoid coils of a great diameter. Accordingly, in an apparatus for depositing a thin film over a large area using the ECR plasma CVD process, since the solenoid coils of great diameter are necessary, it results in a drawback that the size and the weight of the apparatus are increased and the manufacturing cost for the apparatus is expensive.

As one of the methods for forming a deposited film over a large area by improving the foregoing drawbacks in the ECR plasma CVD apparatus, it may be considered to make the thickness of the deposited film uniform by moving the specimen substrate. In this method, however, if the diameter of the plasma generating chamber is set to 2a and the width of the specimen substrate to x, since it requires a length of about (2x−2a) for the width of the deposition chamber, the size of the deposition chamber is increased, which inevitably increases the size of the apparatus per se.

Another method has been proposed in Japanese Patent Laid-Open No. Sho 61-213377. One example for a schematic constitutional view for the plasma CVD apparatus in Japanese Patent Laid-Open No. Sho 61-213377 is as shown in FIG. 10. In FIG. 10, there are shown a plasma generating chamber 1001, a first magnetic field generating device 1002, a microwave guide 1003, a discharge tube 1004, microwave 1005, plasma 1006, a deposition chamber 1007, a rotary specimen table 1008, a specimen substrate 1009, a gas introduction port 1010, a second magnetic field generating device 1011, a third magnetic field generating device 1012 and an exhaust system 1013. In the plasma CVD apparatus shown in FIG. 10, if the area of the specimen substrate is increased, the size of the deposition chamber is necessarily increased to make the distance longer between the first and the second magnetic field generating devices, to thereby decrease the magnetic field component in parallel with the surface of the specimen substrate. Accordingly, it is expected that no uniform deposited film can be obtained. In addition, for obtaining a uniform deposited film, the magnetic field intensity generated by the third magnetic field generating device has to be strengthened which necessarily increases the size of the apparatus. In addition, deposited films are inevitably adhered to the wall surface of the deposition chamber attached with the third magnetic field generating device, which brings about a problem of reducing the utilizing efficiency of starting material gases and causing dusts due to peeling of the adhered films.

SUMMARY OF THE INVENTION

Accordingly, it is an object of the present invention to improve the foregoing problems in the conventional plasma CVD apparatus or ECR plasma CVD apparatus and provide an apparatus for depositing a thin film of satisfactory quality at a high deposition rate over a great area with satisfactory film thickness distribution.

The foregoing object of the present invention can be attained by a microwave plasma CVD apparatus in which material gases are formed into plasmas by electric discharge of microwaves in a plasma generating chamber provided with a first magnetic field generating device, introduced into a deposition chamber and reacted with starting material gases introduced into the deposition chamber, to form a deposited film on a specimen substrate, wherein a second magnetic field generating device is situated at the back of a specimen table which is disposed in a deposition chamber with one of magnetic poles thereof being faced to the magnetic pole, of opposite polarity, of the first magnetic field generating device disposed on the side of the deposition chamber, so that time-averaged magnetic flux density is made uniform on the surface of the specimen substrate.

According to the present invention, since the magnetic flux density is made uniform on the surface of the specimen substrate, it is possible to make the plasma density more uniform on the specimen substrate and make the film thickness distribution of the deposited film more uniform.

BRIEF DESCRIPTION OF THE DRAWINGS

FIG. 3-1(A) illustrates the magnetic flux density on the substrate from a magnetic field generating device;

FIG. 3-1(B) illustrates the staying time at the scanning portion from a magnetic field generating device;

FIGS. 4-1, 4-2 and 4-3 are, respectively, views for explaining examples in which the second magnetic field generating device according to the present invention comprises a plurality of divided and small fixed magnets;

DETAILED DESCRIPTION OF THE INVENTION

Most prominent features of the present invention resides in disposing the second magnetic field generating device at the back of a specimen table in a microwave plasma CVD apparatus, wherein (1):(i) the magnetic field generating device is scanned in parallel with the surface of the specimen substrate, while keeping the magnetic flux density generated therefrom constant and varying the staying time depending on the scanning position, thereby making the time-averaged magnetic flux density uniform, or (ii) scanning the magnetic field generating device depending on the scanning position while varying the magnetic flux density of the device, thereby making the time-averaged magnetic flux density uniform on the surface of the specimen substrate, or (2) the second magnetic field generating device comprises a plurality of divided and fixed small magnets and the magnetic flux density for each of the magnets is so controlled as to make the magnetic flux density uniform on the specimen substrate and, further, (3) the magnetic flux density measured by a plurality of magnetic flux density measuring instruments disposed in the deposition chamber is fed back to make the time-averaged magnetic flux density uniform on the surface of the specimen substrate.

Figure 5:
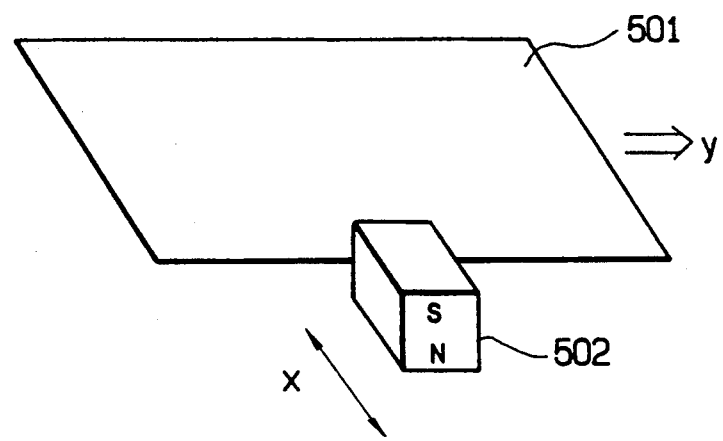
FIGS. 5 and 6 are schematic views illustrating the scanning direction of the second magnetic field generating device according to the present invention.
Figure 6:
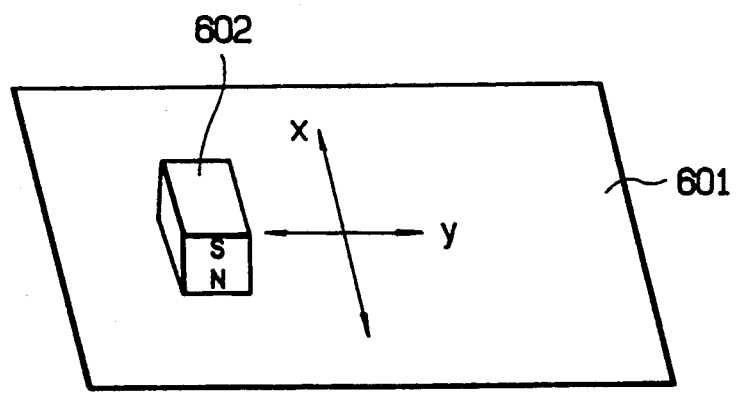

FIGS. 5 and 6 are schematic views illustrating a relationship between the specimen substrate and the scanning direction of the second magnetic field generating device for explaining the feature (1) according to the present invention as described above in which reference numerals 501 and 601 respectively denote specimen substrates and 502 and 602, respectively, denote a second magnetic field generating device.

FIG. 5 shows a case in which a film is deposited while transporting the specimen substrate along axis y, in which a uniform deposited film can be obtained by scanning the second magnetic field generating device along axis x. Further, more uniform deposited film can be obtained by properly varying the staying time or the magnetic flux density depending on the scanning positions of the second magnetic field generating device. Further, the time-averaged magnetic flux density on the surface of the specimen substrate can be made substantially constant and uniform deposition is possible by disposing a plurality of magnetic flux density measuring instruments in the deposition chamber, thereby measuring magnetic flux density and applying feedback to the staying time or the magnetic flux density during scanning of the second magnetic field generating device.

The magnetic pole of the second magnetic field generating device are disposed in the direction opposed to the magnetic field of the first magnetic field generating device. That is, if the N pole of the first magnetic field generating device is situated on the side of the deposition device, the second magnetic field generating device is disposed such that S pole thereof is situated on the side of the specimen table. On the contrary, if the S pole of the first magnetic field generating device is situated on the side of the deposition device, the second magnetic field generating device is situated such that the N pole thereof is situated on the side of the specimen table. The magnetic flux density generated from the second magnetic field generating device is preferably from 100 to 20,000 gauss. The magnetic flux density generated from the first magnetic field generating device is preferably from 100 to 3000 gauss for increasing the plasma density with no restriction by the ECR conditions and converging the magnetic flux between the first and the second magnetic field generating devices. In the first magnetic field generating device, an electromagnet is used in a case of varying the magnetic flux density depending on the conditions used or of using under high magnetic flux density condition, or a permanent magnet is used in a case where size - reduction is necessary.

In the second magnetic field generating device, it is preferred to use an electromagnet in a case of varying the magnetic flux density and to use a permanent magnet in a case where high operationability and size reduction are required. The second magnetic field generating device may be disposed either to the inside or the outside of the deposition chamber.

As the permanent magnet used in the first or the second magnetic field generating device, those having great residual magnetic flux density are desired, for which iron-chromium-cobalt magnet, Alniico magnet, rare earth magnet, ferrite magnet, etc. are suitable.

Gases used in the present invention are dependent on the kind of deposited films as described below.

As a starting material gas used for depositing amorphous silicon or crystalline silicon thin films, there can be mentioned those gases containing silicon atoms, for example, $SiH_4$, $Si_2H_6$, $SiF_4$, $SiHF_3$, $SiH_2F_2$, $SiH_3F$, $Si_2F_6$ $SiCl_4$, $SiH_2Cl_2$ and $SiH_3Cl$. Those gases which are liquid at normal temperature or normal pressure such as $SiCl_4$ are used after gasifying by means of bubbling with an inert gas, etc.

As the material gas used for the generation of plasmas, there can be mentioned $H_2$, $F_2$, $Cl_2$, He, Ne, Ar, Kr and Xe, in addition to the starting gases as described above.

As the starting material gas for depositing amorphous silicon germanium film, a gas mixture prepared by mixing the starting material gas containing silicon atoms used for the deposition of the amorphous silicon described above with a germanium atom-containing gas such as $GeH_4$ or $GeF_4$ is used. As the material gas used for the generation of plasmas, there can be mentioned a gas mixture of a silicon atom-containing gas and a germanium atom-containing gas, as well as $H_2$, $F_2$, $Cl_2$, He, Ne, Ar, Kr and Xe.

As the starting material gas used for depositing a silicon nitride thin film, there may be used the silicon atom-containing gas used for depositing the amorphous silicon as described above or a gas mixture prepared by mixing at least one of gases selected from nitrogen atom-containing $N_2$, $NH_3$ or $NF_3$ with a silicon atom-containing gas. As the gas used for the generation of plasmas, there can be mentioned $N_2$, $NH_3$, $NF_3$, $H_2$, $F_2$, $Cl_2$, He, Ne, Ar, Kr or Xe, in addition to the starting material gas described above. In the case of forming silicon nitride, it is necessary that the starting material gas or the plasma-generating gas at least contains a nitrogen atom-containing gas and a silicon-containing gas.

As the starting material gas in the case of depositing the thin silicon oxide film, there may be used the silicon atom-containing gas used for depositing amorphous silicon as described above, or a gas containing oxygen $O_2$ or silicon atoms. As the gas used for the generation of plasmas, there can be mentioned $O_2$, $H_2$, $F_2$, $Cl_2$, He, Ne, Ar, Kr or Xe, in addition to the starting material gas as described above. In the case of forming silicon oxide, it is necessary that the starting material gas or plasma generating gas at least contains $O_2$ and silicon atom-containing gas.

As the starting material gas for depositing a thin amorphous silicon carbide film, there may be used the silicon atom-containing gas used for depositing the amorphous silicon as described above, gases containing silicon atoms and carbon atoms such as $Si(CH_3)_4$, or a gas mixture prepared by mixing at least one of gases containing carbon atoms such as $CH_4$, $C_2H_2$, $C_2H_6$ with the silicon atom-containing gas as described above. As the gas used for generating the plasmas, there can be mentioned carbon atom-containing gas, $H_2$, $F_2$, $Cl_2$, He, Ne, Ar, Kr or Xe, in addition to the starting material gas as described above. In the case of forming amorphous silicon carbide, it is necessary that the starting material gas or the plasma generating material gas at least contains a carbon atom-containing gas and a silicon atom-containing gas. As the starting material gas in the case of depositing the thin diamond film, there can be mentioned carbon atom-containing gas such as $CH_4$, $C_2H_4$, $C_2H_6$, $CH_3COCH_3$, $CH_3OH$, etc. $CH_3COCH_3$ or $CH_3OH$ is used after gasifying by means of bubbling with inert gas. As the gas for generating plasmas, there can be mentioned $H_2$, $F_2$, $Cl_2$, He, Ne, Ar, Kr or Xe, in addition to the carbon atom-containing gases described above.

As has been described above, the starting material gas may be used both as a plasma generating gas. Further, the starting material gas may be used by being diluted with an inert gas such as He or Ar. In a case where impurity is added to the deposited film, a gas such as $PH_3$, $PF_3$, $PCl_3$, $PCl_5$, $B_2H_6$, $BF_3$, $BBr_3$, $AsF_5$, $AsCl_3$, $AsH_3$, $I_2$, $SbH_3$, $SbF_5$, etc. is mixed into the starting material gas or the plasma generating gas. Upon forming thin films of amorphous silicon, crystalline silicon, amorphous silicon germanium, silicon nitride, silicon oxide or amorphous silicon carbide, the reaction pressure is preferably from $10^{-5}$ to $10^{-1}$ Torr.

The reaction pressure upon forming a thin diamond film is preferably from $10^{-3}$ to $10^{-2}$ Torr.

In the present invention, although microwave electric discharge is used as the method of generating plasmas, it is also possible to further apply optical energy such as of ultraviolet rays, laser beams, etc. or heat energy in order to accelerate the reaction in the thin film depositing reaction.

DESCRIPTION OF THE PREFERRED EMBODIMENTS

Apparatus Example 1

Figure 1:
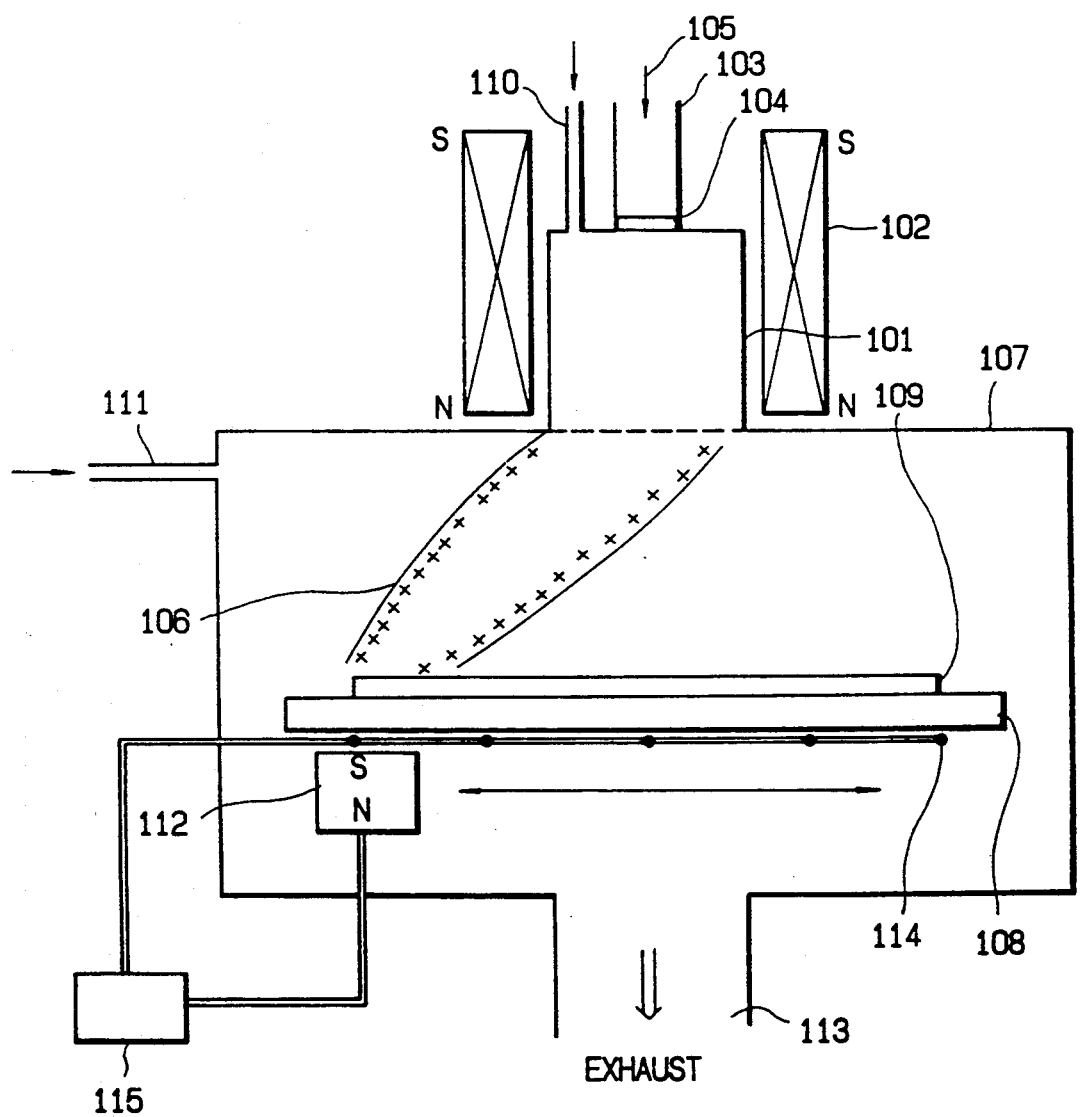
FIG. 1 is a schematic constitutional view for one embodiment of a microwave plasma CVD apparatus according to the present invention.

FIG. 1 illustrates an example of an apparatus in which the second magnetic field generating device is caused to scan in parallel with the surface of a specimen substrate (along axis, x, y).

In FIG. 1, there are shown a plasma generating chamber 101, a first magnetic field generating device 102, a microwave guide 103, a microwave introducing window 104, microwave 105, plasma 106, a deposition chamber 107, a specimen table 108 having heater, a specimen substrate 109, a first gas introduction port 110, a second gas introduction 111, a second magnetic field generating device 112, an exhaust system 113, a hall effect device 114, a system 115 incorporating a gauss meter for the feedback control of magnetic flux density. Illustration of a microwave source, scanning mechanism for the second magnetic field generating device and an exhaust pump is omitted. The feature of the apparatus in this example resides in that the second magnetic field generating device 112 is scanned in parallel with the surface of the specimen substrate, thereby scanning the magnetic flux converging from the first magnetic field generating device to the second magnetic field generating device, to make the distribution of the film thickness uniform for the thin film deposited on the specimen substrate. The plasma generating chamber 101 has a cavity resonator structure.

The microwave plasma CVD apparatus according to the present invention is operated by the method as described below.

Gas to be activated (for example, inert gas such as He, Ne, Ar, Kr or Xe or $H_2$, $N_2$, $O_2$ or starting material gas containing elements constituting the main ingredients of the deposited film) is introduced from the gas introduction port 110, while microwave is transmitted from a microwave source not illustrated by using the wavelength 103 and through the introducing window 104 into the plasma generating chamber to generate plasmas. Then the second magnetic field generating device is scanned to introduce the plasmas uniformly on the specimen substrate 109 in the deposition chamber 107. Then, starting material gas is introduced through the gas introduction port 111, and subjected to decomposing reaction, to deposit a thin film on the specimen substrate.

Apparatus Example 1A

The Apparatus Example 1 was actually embodied as Apparatus Example 1A by setting the diameter of the plasma generating chamber to 170 mm by incorporating 30 pieces of rare earth cobalt magnets each of residual magnetic flux density of 9.0 KG, coercive force of 8.4 KOe, and maximum energy product of 20 MGOe are incorporated to the outside of the plasma generating chamber as the first magnetic field generating device, so that the magnetic flux density at the center of the plasma generating chamber was 200 gauss, while incorporating a ferrite magnet with the residual magnetic flux density of 4.0 KG, coercive force of 3.5 KOe and maximum energy product of 3.6 MGOe to the inside of the plasma generating chamber as the second magnetic field generating device. The magnetic flux density was measured by a gauss meter-incorporated system for the feedback control of the magnetic flux density and feeding it back during staying time whereby scanning was possible in parallel with the surface of the specimen substrate (in the direction of axis x, y), so that the time-averaged magnetic flux density was made uniform on the specimen substrate.

Apparatus Example 1B

The Apparatus Example 1 was embodied as Apparatus Example 1B in the same way as for the Apparatus Example 1A except for using an electromagnet such that the magnetic flux density at 876 gauss was formed near the microwave introducing window as the second magnetic field generating device 102 and making the scanning possible in parallel with the surface of the specimen substrate (in the direction of axis x, y) by controlling the electric current to the electromagnet so that the time-averaged magnetic flux density was uniform on the specimen substrate.

Apparatus Example 2

Figure 2:
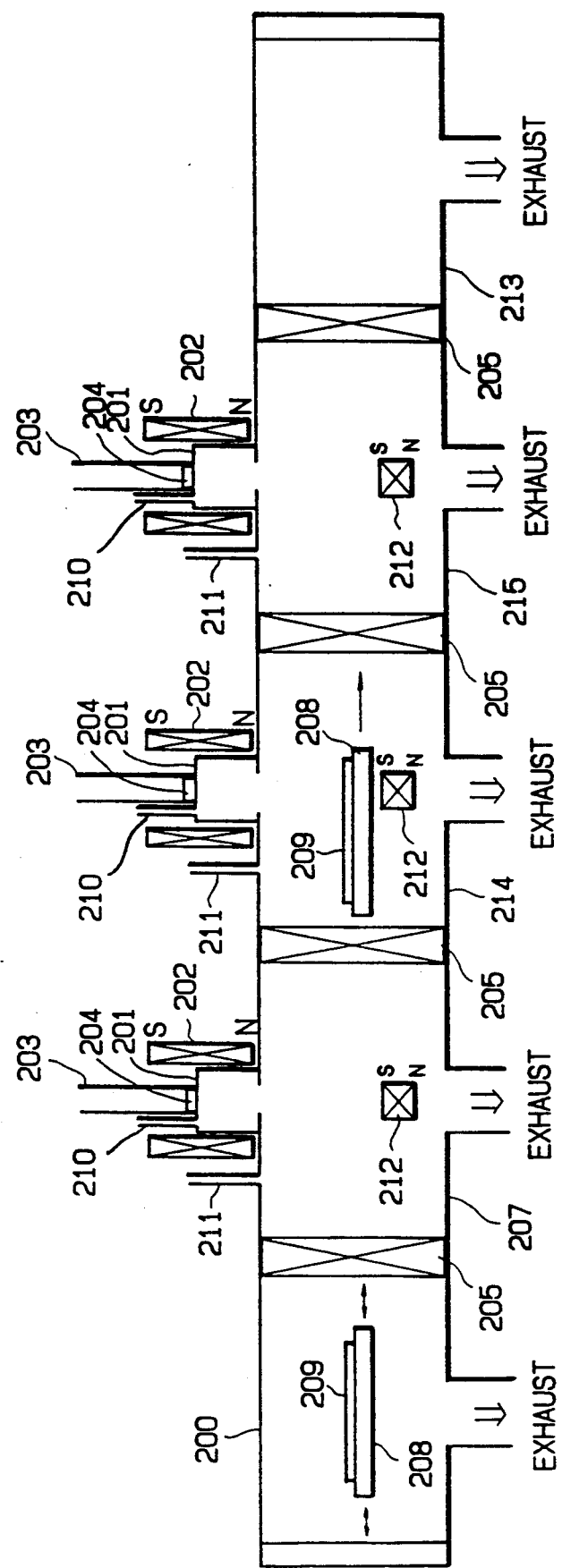
FIG. 2 is a schematic constitutional view for one embodiment of a continuous microwave plasma CVD apparatus to which the present invention is applied.

FIG. 2 shows one embodiment of an in-line type continuous deposition apparatus in which one or more set of the apparatus shown in FIG. 1 were incorporated. In FIG. 2, there are shown a loading chamber 200, a plasma generating chamber 201, a first magnetic field generating device 202, a microwave guide 203, a microwave introducing window 204, a gate valve 205, a deposition chamber 207, a specimen table 208, a specimen substrate 209, a first gas introduction port 210, a second gas introduction port 211, a second magnetic field generating device 212, a loading chamber 213, a second deposition chamber 214 and a third deposition chamber 215.

In FIG. 2 transportation mechanism for the specimen substrate, scanning mechanism for the second magnetic generating device, heating device for the specimen substrate, microwave source and vacuum pump are not illustrated.

The diameter of the plasma generating chamber was set to 170 mm, the second magnetic field generating device was scanned only along one axis for transporting the specimen substrate and the scanning direction is perpendicular to the sheet of the drawing in FIG. 2.

Apparatus Example 3

Figure 3:
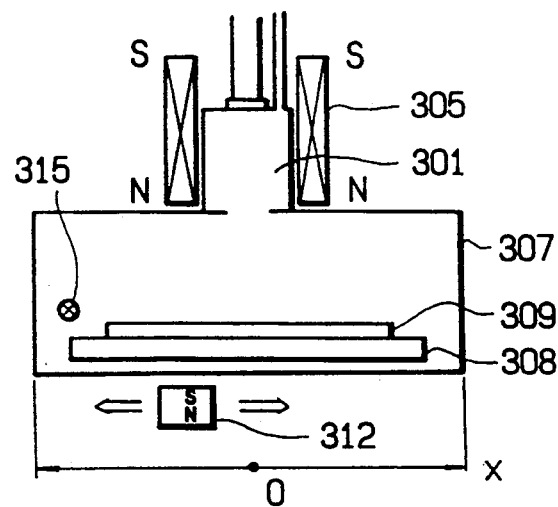
FIGS. 3-(1)A, and 3-(1)B, 3-2 and 3-3 are, respectively views for explaining examples in which the magnetic flux density generated from the second magnetic field generating device according to the present invention is made constant while the staying time depending on the scanning positions is varied.
Figure 3:
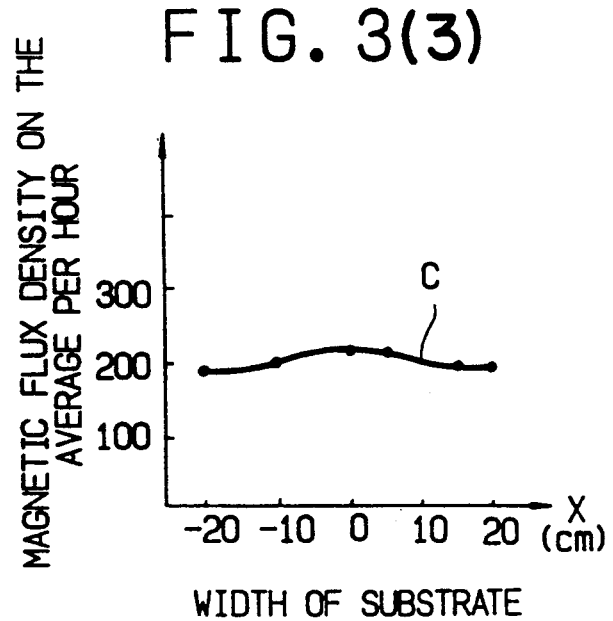

FIG. 3-2 shows an apparatus example in which the second magnetic field generating device is scanned in parallel with the surface of the specimen substrate (only along axis x). In FIG. 3-2, there are shown a deposition chamber 308, a first magnetic field generating device 302, a second magnetic field generating device 312, a plasma generating chamber 301, a specimen substrate 309 and a specimen table 308. The specimen table 308 is transported along the direction 315 which is in perpendicular to the surface of the drawing. FIG. 3-2 shows an apparatus in which the time-averaged magnetic flux density is made substantially uniform on the surface of the specimen substrate by varying the staying time depending on the scanning positions for the second magnetic field generating device. The second magnetic field generating device is scanned only along one axis (axis x). Scanning mechanism for the second magnetic field generating device is not illustrated. FIG. 3-1(a) shows one example of the magnetic flux density on the specimen substrate obtained only from the first magnetic field generating device, while (b) in the figure shows the staying time at the scanning position for the second magnetic field generating device in the direction of axis x in a case where the magnetic flux density at the surface is 1000 gauss. Further, by the scanning for the second magnetic field generating device shown in FIG. 3-1(b), a substantially uniform time-averaged magnetic flux density can be obtained on the specimen substrate as shown in FIG. 3-3(c). In FIG. 3-2, uniform magnetic flux density can be obtained on the specimen substrate also by scanning the second magnetic field generating device comprising an electromagnet cable of varying the magnetic flux density in the direction of axis x instead of using the second magnetic field generating device that varies the staying time depending on the scanning positions in the direction of axis x. Further, the magnetic flux density on the specimen substrate can be made more uniformly by measuring the magnetic flux density by a gauss meter, etc. using hall effect devices in the deposition chamber and feeding-back the measured density to the magnetic flux density of the second magnetic field generating device.

Apparatus Example 4

Figure 4I:
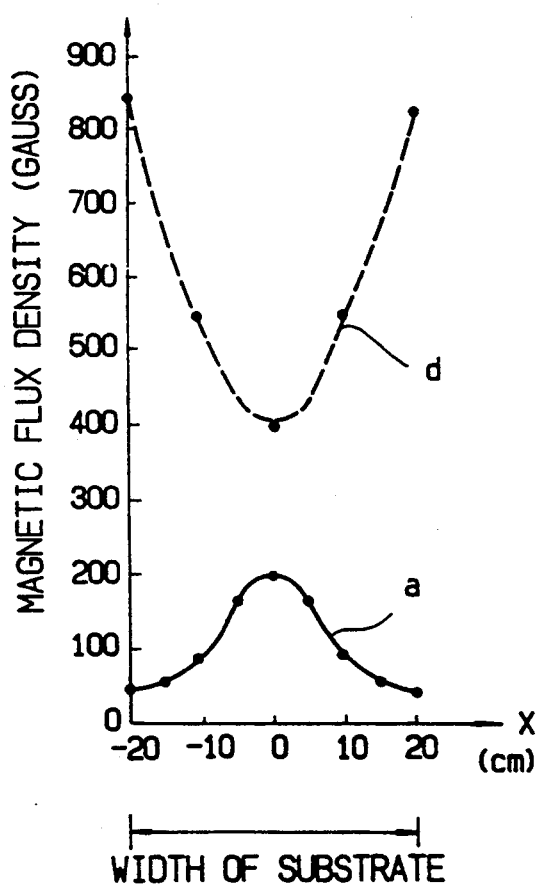
Figure 4:
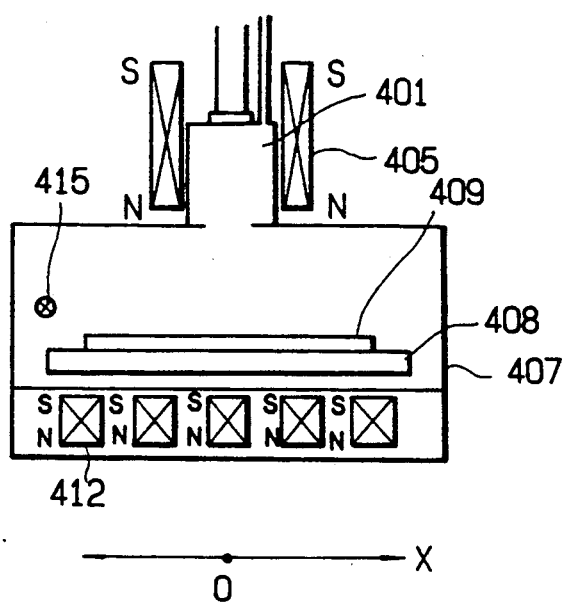
Figure 4:
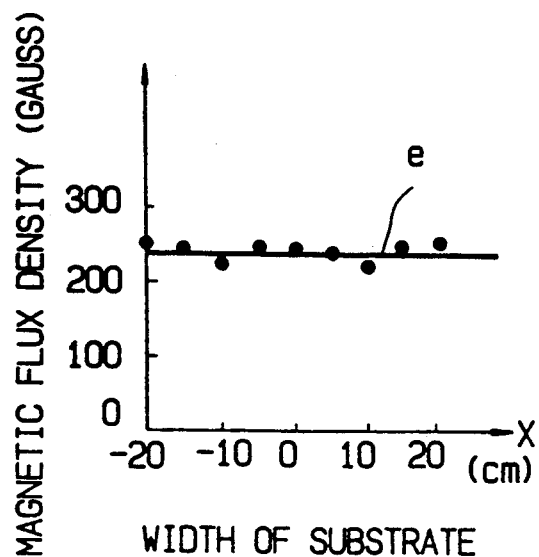

FIG. 4-2 shows an example of apparatus in which the second magnetic field generating device comprises a plurality of divided and fixed small magnets. In FIG. 4-2, there are shown a plasma generating chamber 401, a first magnetic field generating device 402, a deposition chamber 407, a specimen table 408, a specimen substrate 409 and a second magnetic field generating device 412. The specimen table is transported in the direction 415 which is perpendicular to the surface of the drawing.

FIG. 4-1(a) shows one example of the magnetic flux density in the direction of axis x in FIG. 4-2 on the specimen substrate only by means of the first magnetic field generating device. On the other hand, FIG. 4-1(d) shows the magnetic flux density generated from the second magnetic field generating device. By the combination of the magnetic field (d) from the second magnetic field generating device and the magnetic field (a) from the first magnetic field generating device, a substantially uniformly magnetic field density is obtained in the direction of the axis x of the specimen substrate 413 as shown in FIG. 4-3(e).

Film-Forming Example 1

A silicon nitride film was formed by using the microwave plasma CVD apparatus in the Apparatus Example 1A.

A cleaned glass substrate #7059, manufactured by Corning Co. and a wager substrate made of silicon single crystal wafer were mounted to the specimen table 108 and the inside was evacuated to high vacuum region of $1 \times 10^{-6}$ Torr. $N_2$ gas was introduced at 20 sccm from the gas introduction port 110 into the plasma generating chamber 101, the pressure in the deposition chamber 107 was controlled to a constant value of $2 \times 10^{-3}$ Torr and 300 W of microwave power at 2.4 GHz was charged to the first magnetic field generating device. Then the magnetic flux density was measured and fed-back during staying time so that the time-averaged magnetic flux density was made uniform on the specimen substrate and the second magnetic field generating device was scanned in parallel with the surface of the specimen substrate (in the direction of axis x, y). Then $SiH_4$ was introduced at 10 sccm from the gas introduction port 111 into the deposition chamber 107 and reacted for 10 min to form a silicon nitride film on the specimen substrate. The thickness of the silicon nitride film thus obtained was 4,400 Å in average and the deposition rate was 7.3 Å/sec. The film thickness distribution over the area of 30 cm × 30 cm was ±5%.

Silicon nitride films were formed under the same deposition conditions as those in Film-Forming Example 1 for both of the case where the second magnetic field generating device was not disposed and the case where the second magnetic field generating device was fixed at the center of the specimen substrate respectively. The film thickness distribution in each of the cases for the range of 30 cm × 30 cm area was ±17% and 35 33%.

The etching rate for the silicon nitride film formed on the silicon single crystal substrate by the apparatus according to the present invention with a buffered fluoric acid solution (50% HF:40% $NH_4F$=15:85) was 95 ÅA/min.

Film-Forming Example 2

An amorphous silicon film was formed by using the microwave plasma CVD apparatus of Apparatus Example 1B. 100% $SiH_4$ as the reaction gas was introduced at 20 sccm from the gas introduction port 110, the pressure in the deposition chamber was controlled to $3 \times 10^{-4}$ Torr, the substrate temperature was controlled at 200° C. and microwave power of 350 W was charged in the same manner as in Film-Forming Example 1. The gas was reacted for 20 min to form an amorphous silicon film on the specimen substrate. For the amorphous silicon film over a range of 30 cm × 30 cm area, the film thickness distribution was ±6% and the average film thickness was 14,500 Å. The deposition rate was 12 Å/sec. For the photoelectronic property of the resultant amorphous silicon film, the ratio $\sigma_p/\sigma_d$ between the light conductivity $\sigma_p$ and the dark conductivity $\sigma_d$ under irradiation of AM 1 (100 mW/cm$^2$) was $5 \times 10^5$.

Film-Forming Example 3

Polycrystalline silicon was formed by using the microwave plasma CVD apparatus of Apparatus Example 1B. In the same manner as in Film-Forming Example 2, there were introduced $H_2$ at 50 sccm and Ar at 50 sccm from the gas introduction port 111 and $SiH_2Cl_2$ and 5 sccm from the gas introduction port 111, the pressure in the deposition chamber was controlled to $1 \times 10^{-3}$ Torr and the substrate temperature was controlled to 350° C., and the microwave power of 300 W was charged. The gases were reacted for 60 min to obtain thin silicon films on quartz glass and (110) single crystal silicon substrates. From the result of the measurement of RHEED (reflection high speed electron beam diffractometry) for the resultant thin silicon films, it was found that the films were crystallized. It was confirmed that the film comprised polycrystalline of (110) orientation on the quartz glass substrate, while epitaxially grown structure on the (110) single crystal silicon substrate. The film thickness distribution within a range of 30 cm × 30 cm area was ±5%, the average film thickness was 11,000 Å and the deposition rate was 3.1 Å/sec.

Film-Forming Example 4

An amorphous silicon thin film transistor (hereinafter simply referred to as a Si-TFT) was manufactured by using the microwave plasma CVD apparatus in Apparatus Example 2.

Figure 7:
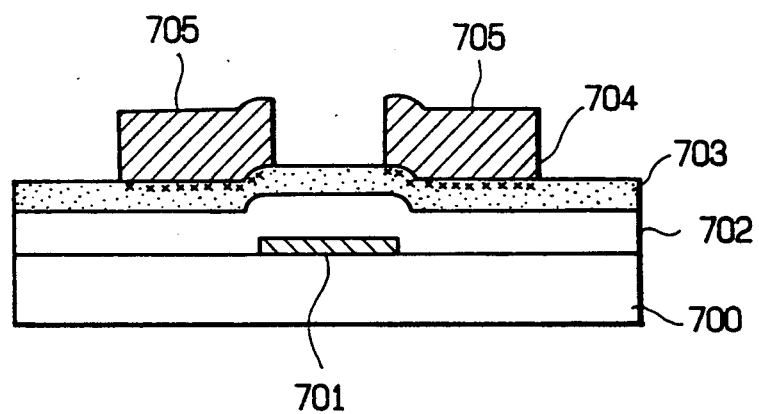
FIG. 7 is a cross sectional constitutional view for a-Si-TFT prepared in Example 4.
Figure 8:
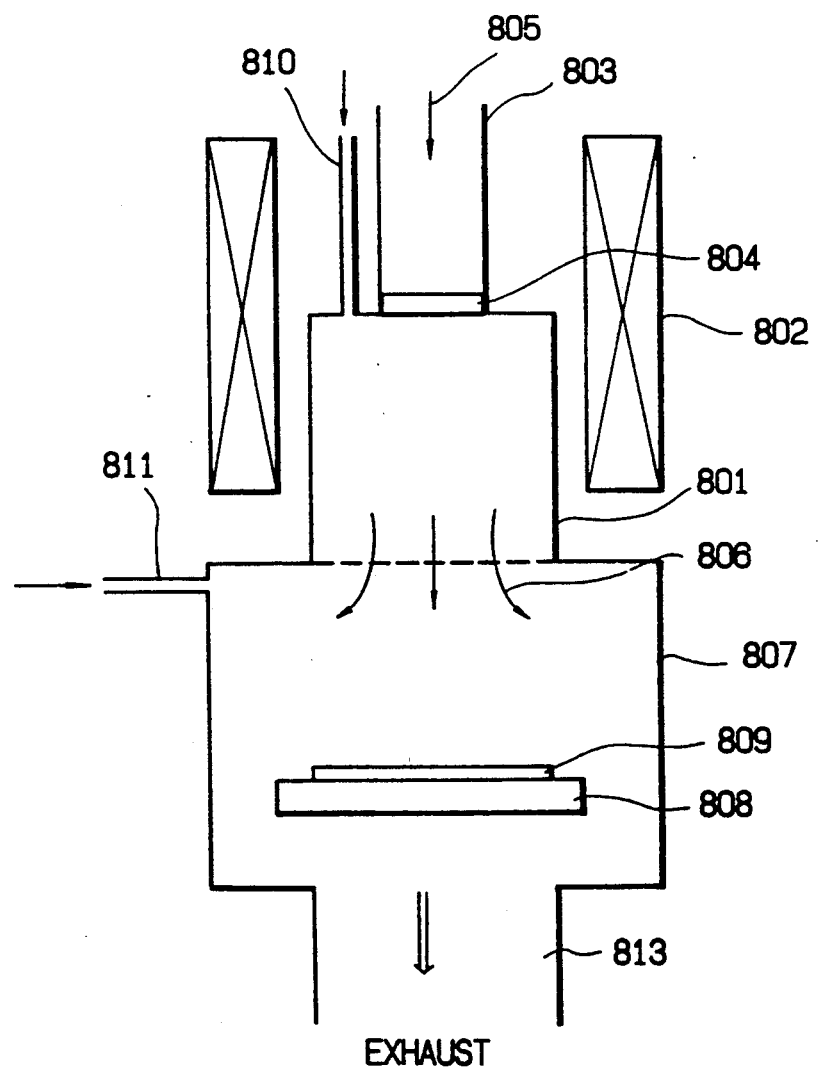
FIG. 8 is a schematic constitutional view of a conventional ECR plasma CVD apparatus.
Figure 9:
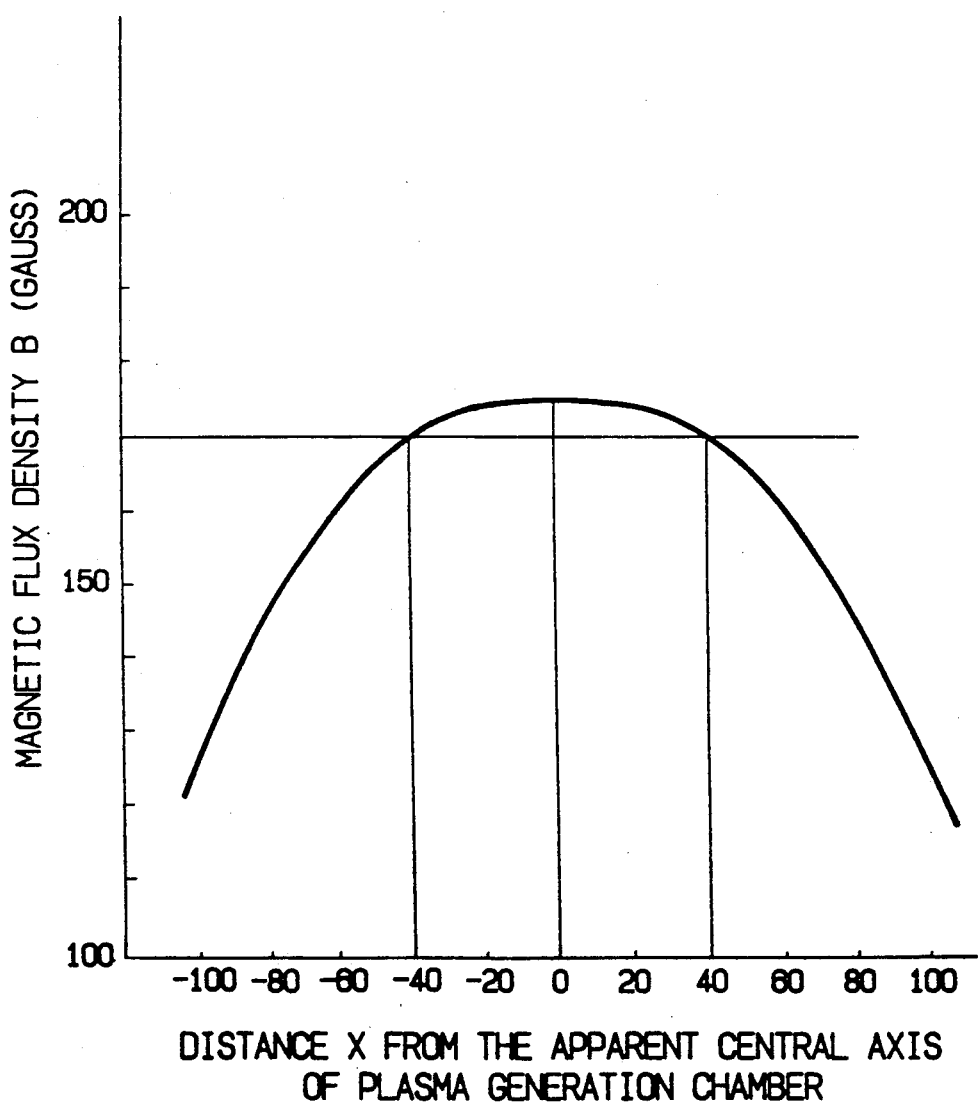
FIG. 9 is a view showing the distribution of a magnetic flux density on the surface of a specimen substrate in the ECR plasma CVD apparatus in FIG. 8.
Figure 10:
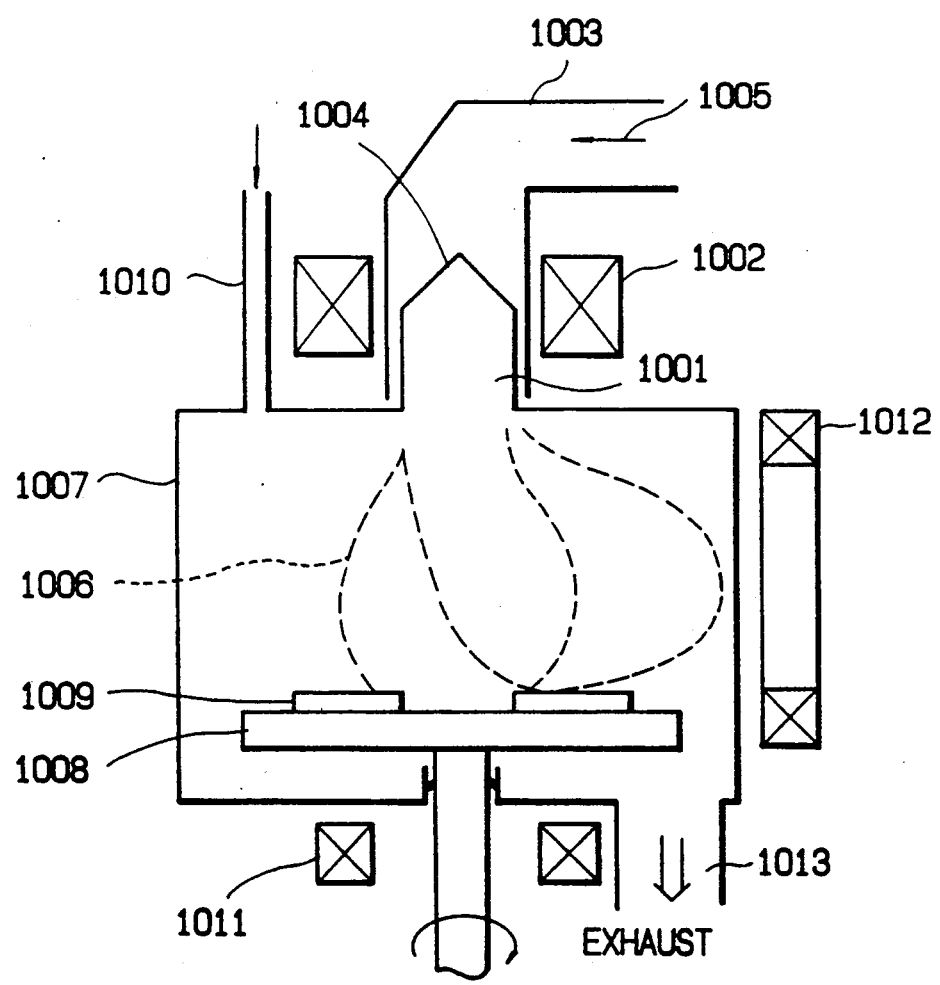
FIG. 10 is a schematic constitutional view of a conventional ECR plasma CVD apparatus used for increased area.

FIG. 7 shows a schematic cross sectional view of an a-Si-TFT manufactured in this film-forming example. In the figure, there are shown an insulting substrate 700, a gate electrode 701, a silicon nitride film 702, an amorphous silicon film 703, an ohmic contact area 704 and a source-drain electrode 705. At first, upon manufacturing, a glass substrate #7059 manufactured by Corning Co. provided with the Al gate electrode 701 was cleaned and mounted to the specimen table 208 in the load chamber 200. Then, the inside of the chamber was evacuated to a high vacuum degree of $1 \times 10^{-6}$ Torr and the temperature for the specimen substrate was controlled to 200° C. Then, the specimen substrate 206 was transported together with the specimen table into the first deposition chamber. $N_2$ was introduced from the gas introduction port 210 while $SiH_4$ was introduced from the gas introduction port 211 and the silicon nitride film 702 was deposited to a thickness of 3,000 Å by the same method as in Film-Forming Example 1. Then, the specimen table was transported to the second deposition chamber 314, to which SiH₄ was introduced from the gas introduction port 210 and the amorphous silicon film 703 was deposited to a thickness of 2,000 Å in the same manner as in Film-Forming Example 3. Further, the specimen substrate was transported to the third deposition chamber 215 and, while maintaining the temperature of the specimen substrate at 200° C., 5,000 ppm of PH₃ diluted with H₂ was introduced at 50 sccm and Ar gas at 50 sccm was introduced from the gas introduction port 210 of the third deposition chamber into the plasma generating chamber 210. Then, while maintaining the pressure of the deposition chamber 215 to $5 \times 10^{-2}$ Torr, they were reacted for 5 min by the same procedures as those in Film-Forming Example 2 for 5 min to form the ohmic contact layer 704. Subsequently, Al was formed to 5,000 Å thickness by sputtering and the source-drain electrode 705 was formed by photolithography and then applied with heat treatment in a nitrogen gas atmosphere at 200° C. for one hour, to prepare an a-SiTFT.

For the performance of the resultant a-SiTFT, in the case of the source-drain voltage $V_D = 10$ V, the ON-OFF current ratio was at the order of 6 digit and the effective mobility (u) of electrons was 0.7 cm²/V.sec as determined by applying the equation used for the case of single crystal MOS transistor: $I_D = W/2-L \times uC_{ox}(V_G - V_T)^2$, where $I_D$: drain current, $V_G$: gate voltage, $V_T$: threshold voltage, u: electron effective mobility, W: channel width, L: channel length and $C_{ox}$: gate capacity per unit, and in accordance with the slope of the linear portion in $\sqrt{I_D} - V_G$.

It has been found from Film-Forming Examples 1, 2 and 3 that it is possible to produce dense silicon nitride film, amorphous silicon film of satisfactory photoelectronic property and polycrystalline silicon film of excellent orientation property over a great area uniformly and at good productivity by using the microwave plasma CVD apparatus according to the present invention.

In addition, it has also been found from Film-Forming Example 4 than an electronic device of satisfactory property can also be manufactured with ease by using the continuous deposition apparatus applying the microwave plasma CVD apparatus according to the present invention.

Although Film-Forming Examples 1, 2, 3, and 4 show those cases of forming silicon nitride, amorphous silicon, polycrystalline silicon and n+ layer, the present invention is not restricted only thereto but it is also effective as an apparatus for manufacturing silicon oxide, amorphous silicon germanium, amorphous silicon carbide, diamond, etc.

As has been described above, according to the present invention, it is possible to obtain a deposited film with uniform film-thickness distribution and homogeneous quality over a large area and with excellent productivity as compared with the conventional plasma CVD apparatus or ECR plasma CVD apparatus.

What is claimed is:

1. In a microwave plasma chemical vapor deposition apparatus for the formation of a functional deposited film on a substrate which comprises a plasma generating chamber and a deposition chamber being separately disposed, said plasma generated chamber comprising a circumferential wall having an end portion thereof provided with a microwave introducing window to which a waveguide extending from a microwave power source is connected and having a first magnetic field generating means outside said circumferential wall for generating a first magnetic field having a first magnetic pole, said plasma generating chamber being provided with means for supplying a plasma-forming raw material gas thereinto, said plasma generating chamber being connected to said deposition chamber through a passage for plasma formed in said plasma generating chamber, said deposition chamber having a substrate holder having a front face capable of holding a substrate onto which a deposited film is to be formed, said deposition chamber being provided with means for supplying a film-forming raw material gas thereinto and means for evacuating said plasma generating chamber and said deposition chamber, the improvement comprising a second magnetic field generating means disposed at a rear face of said substrate holder to generate a second magnetic field having a second magnetic pole of a polarity reverse to that of said first magnetic pole, said second magnetic field being provided in the vicinity of said substrate and positioned opposite to said first magnetic field, said second magnetic field generating means being capable of scanning in a direction parallel to the surface of said substrate to provide a uniform time-average magnetic flux density on the surface of said substrate, wherein the direction of the line of magnetic force caused by said first and said second magnetic field generating means is perpendicular to the surface of said substrate.

2. The microwave plasma chemical vapor deposition apparatus as defined in claim 1, wherein the second magnetic field generating means is an electromagnet comprising solenoid coils, and the apparatus further comprises means for scanning said electromagnet in parallel with the surface of the substrate and controlling the electric current to said solenoid coils, so that the time-averaged magnetic flux density is made uniform on the surface of the substrate.

3. The microwave plasma chemical vapor deposition apparatus as defined in claim 1, wherein the second magnetic field generating means comprises a plurality of fixed magnets and the magnetic flux density for each of the magnets is controlled, so that the magnetic flux density is made uniform on the surface of the substrate.

4. The microwave plasma chemical vapor deposition apparatus as defined in claim 1, wherein the magnetic flux density generated by the first magnetic field generating means is of 100 and 3000 gauss.

5. The microwave plasma chemical vapor deposition apparatus as defined in claim 1, wherein the magnetic flux density generated by the second magnetic field generating means is of 100 to 20000 gauss.

6. In a microwave plasma chemical vapor deposition apparatus for the formation of a functional deposition film on a substrate which comprises a plasma generating chamber and a deposition chamber being separately disposed, said plasma generating chamber comprising a circumferential wall having an end portion thereof provided with a microwave introducing window to which a waveguide extending from a microwave power source is connected and having a first magnetic field generating means outside said circumferential wall for generating a first magnetic field having a first magnetic pole, said plasma generating chamber being provided with means for supplying a plasma-forming raw material gas thereinto, said plasma-generating chamber being connected to said deposition chamber through a passage for plasma formed in said plasma generated chamber, said deposition chamber having a substrate holder having a front face capable of holding a substrate on which a deposited film is to be formed, said deposition chamber being provided with means for supplying a film-forming raw material gas thereinto and means for evacuating said plasma generating chamber and said deposition chamber, the improvement comprising a second magnetic field generating means disposed at a rear face of said substrate holder to generate a second magnetic field having a second magnetic pole of a polarity reverse to the of said first magnetic pole, said second magnetic field being provided in the vicinity of said substrate and positioned opposite to said first magnetic field, said second magnetic field generating means being capable of scanning in a direction parallel to the surface of said substrate to provide a uniform time-averaged magnetic flux density on the surface of said substrate, wherein the magnetic flux density is measured by a plurality of magnetic flux density measuring instruments disposed in the deposition chamber and the measured magnetic flux density is fed back to an instrument for feedback control of the magnetic flux density so that the average magnetic flux density per unit time is made uniform on the surface of the substrate.

7. The microwave plasma chemical vapor deposition apparatus as defined in claim 6, wherein the magnetic flux density generated by the first magnetic field generating means is of 100 to 3000 gauss.

8. The microwave plasma chemical vapor deposition apparatus as defined in claim 6, wherein the magnetic flux density generated by the second magnetic field generating means is of 100 to 20000 gauss.

* * * * *

UNITED STATES PATENT AND TRADEMARK OFFICE
CERTIFICATE OF CORRECTION

PATENT NO. : 5,099,790
DATED : March 31, 1992
INVENTOR(S) : SOICHIRO KAWAKAMI

Page 1 of 3

It is certified that error appears in the above-identified patent and that said Letters Patent is hereby corrected as shown below:

Item [57], Abstract:

Line 4, "device" should read --device,--.

SHEET 3 OF 10

FIG. 3(1)-A, Label should read, --WIDTH OF SUBSTRATE--.

COLUMN 1

Line 48, "films,:" should read --films;--.
    Line 51, "low,:" should read --low;--.

COLUMN 2

Line 27, "flux film" should read
        --flux density uniform over a wide range
          for obtaining a deposited film--.

COLUMN 3

Line 7, "dusts" should read --dust--.
    Line 11, "improve" should read --solve--.
    Line 48, "tively" should read --tively,--.
    Line 65, "cross sectional" should read
        --cross-sectional--.

COLUMN 4

Line 11, "resides" should read --reside--.
    Line 59, "are" should read --is--.

UNITED STATES PATENT AND TRADEMARK OFFICE
CERTIFICATE OF CORRECTION

PATENT NO. : 5,099,790
DATED : March 31, 1992
INVENTOR(S) : SOICHIRO KAWAKAMI

It is certified that error appears in the above-identified patent and that said Letters Patent is hereby corrected as shown below:

COLUMN 5

Line 25, "Alniico" should read --Alnico--.
Line 33, "$Si_2F_6SiCl_4$," should read --$Si_2F_6$, $SiCl_4$,--.

COLUMN 6

Line 67, "second gas introduction 111," should read --second gas introduction port 111,--.

COLUMN 7

Line 26, "Then" should read --Then,--.

COLUMN 8

Line 7, "set" should read --sets--.
Line 38, "in" should be deleted.
Line 67, "uniformly" should read --uniform--.

COLUMN 9

Line 25, "substrate 413" should read --substrate 409--.
Line 33, "wager" should read --wafer--.
Line 63, "35 33%." should read --±33%.--.
Line 68, "ÅA/min." should read --Å/min.--.

COLUMN 10

Line 5, "$Sih_4$" should read --$SiH_4$--.
Line 26, "and" (second occurrence) should read --at--.
Line 49, "cross sectional" should read --cross-sectional--.

UNITED STATES PATENT AND TRADEMARK OFFICE
CERTIFICATE OF CORRECTION

PATENT NO. : 5,099,790
DATED : March 31, 1992
INVENTOR(S) : SOICHIRO KAWAKAMI

Page 3 of 3

It is certified that error appears in the above-identified patent and that said Letters Patent is hereby corrected as shown below:

COLUMN 11

Line 11, "plasma generating chamber 210." should read --plasma generating chamber 201.--.
Line 23, "6 digit" should read --6 digits--.
LIne 64, "generated" should read --generating--.

COLUMN 12

Line 47, "100 and 3000 gauss." should read --100 to 3000 gauss.--.
Line 53, "deposition" should read --deposited--.
Line 67, "generated" should read --generating--.

COLUMN 13

Line 10, "the" should read --that--.

Signed and Sealed this

Thirteenth Day of July, 1993

Attest:

MICHAEL K. KIRK

*Attesting Officer*   *Acting Commissioner of Patents and Trademarks*